United States Patent [19]
Yamazaki

[11] Patent Number: 5,877,124
[45] Date of Patent: Mar. 2, 1999

[54] SUPERCONDUCTING CERAMIC PATTERN AND ITS MANUFACTURING METHOD

[75] Inventor: Shumpei Yamazaki, Tokyo, Japan

[73] Assignee: Semiconductor Energy Laboratory Co., Ltd., Kanagawa, Japan

[21] Appl. No.: 443,170

[22] Filed: May 17, 1995

Related U.S. Application Data

[63] Continuation of Ser. No. 139,863, Oct. 22, 1993, abandoned, which is a continuation of Ser. No. 914,636, Jul. 17, 1992, abandoned, which is a continuation of Ser. No. 815,583, Dec. 30, 1991, abandoned, which is a continuation of Ser. No. 176,144, Mar. 31, 1988, abandoned.

[30] Foreign Application Priority Data

Apr. 15, 1987 [JP] Japan .................................. 62-93732
Apr. 15, 1987 [JP] Japan .................................. 62-93733

[51] Int. Cl.[6] .................................................. H01L 39/00
[52] U.S. Cl. .......................... 505/220; 505/230; 505/234; 505/237; 505/238; 505/701; 505/703; 505/706; 428/210; 428/701; 428/702; 428/901; 428/930
[58] Field of Search .................................. 428/688, 689, 428/210, 209, 901, 702, 930, 701; 505/190, 191, 192, 220, 230, 232, 234, 237, 238, 239, 701, 703, 706; 257/34, 35

[56] References Cited

U.S. PATENT DOCUMENTS

| | | | |
|---|---|---|---|
| 4,316,785 | 2/1982 | Suzuki et al. | 29/599 |
| 4,826,808 | 5/1989 | Yurek | 428/930 |
| 4,837,609 | 6/1989 | Gurvitch | 505/1 |
| 4,960,751 | 10/1990 | Yamazaki | 505/1 |
| 5,571,777 | 11/1996 | Tanaka et al. | 505/237 |

FOREIGN PATENT DOCUMENTS 0287383  10/1988  European Pat. Off. .

OTHER PUBLICATIONS

"Ion Implantation In Superconducting Niobium and $Nb^3Sn$ Thin Films: Adjustment of Josephson Microbridges and Squid", J.Y. Robic et al., International Conference on Ion Beam Modification of Materials, 4–8 Sep. 1978, Budapest Hungary, vol. III.
Nakajima, et al., Appl. Phys. Lett 53 (15) Oct.19,1988 pp. 1437–1439.
Koinuma et al., Jap. Jour. of Appl. Phys. vol. 26, No. 5, Nov. 1987 pp. L 763–L765.
Sahu et al., "Overview of High Tc Superconductivity"in Chemistry of High–Temperature Superconductors II, (1988) Chapter 1.
Doss, Engineer's Guide to High Tc Supercond., Wiley & Sons, 1989, pp. 29–33.
Elliot, "Integrated Circuit Fabricatiion Technology" McGraw Hill Book Co., 1982 pp. 38–41.
Geballe, "Paths to Higher Temperature Superconductors" Science vol. 259, Mar. 12, 1993, p. 1550.
Science News vol. 135, #9, p. 143.
"Cuprate Superconductors" C & EN May 10, 1993 pp. 4–5.
Businessweek, "Superconductors," Apr. 6, 1987 pp. 94–99.
Elliot "Integrated Circuit Fabrication Technology" McGraw Hill, 1982 pp. 13–15.
"Superconductor's Materials Problems"Science vol. 240, Apr. 1, 1988 pp. 25–27.
CA 110 (8) :67780 n High Tc Superconductivity of $B_1SrCaCoO$ doped with Manganese 10988 Gololovob et al.

*Primary Examiner*—Marie Yamnitzky
*Attorney, Agent, or Firm*—Sixbey, Friedman, Leedom & Ferguson, P.C.; Gerald J. Ferguson, Jr.; Jeffrey L. Costellia

[57] ABSTRACT

A superconducting oxide ceramic pattern is described. The pattern is comprised of a high Tc superconducting region and a low Tc superconducting region which exhibits a resistivity at the liquid nitrogen temperature while the high Tc region is superconducitive at that temperature. The low Tc region is doped with impurity such as Si and then subjected to thermal treatment to oxidizing the impurity.

49 Claims, 3 Drawing Sheets

FIG.I(A)
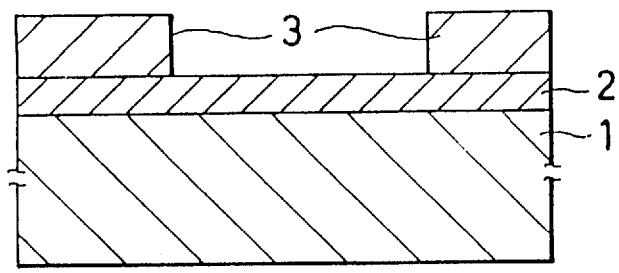
FIG.I(B)
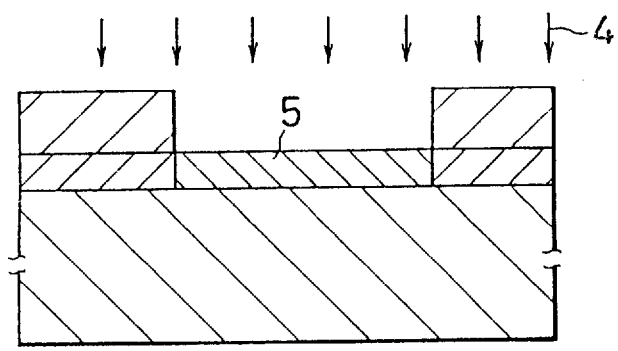
FIG.I(C)
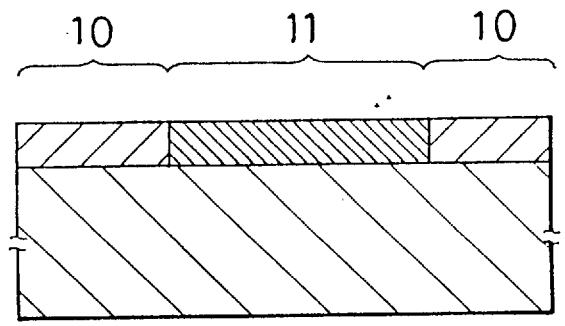

SUPERCONDUCTING CERAMIC PATTERN AND ITS MANUFACTURING METHOD

This application is a Continuation of Ser. No. 08/139,863, filed Oct. 22, 1993, now abandoned; which itself is a continuation of Ser. No. 07/914,636, filed Jul. 17, 1992, now abandoned; which is a continuation of Ser. No. 07/815,583, filed Dec. 30, 1991, now abandoned; which is a continuation of Ser. No. 07/176,144, filed Mar. 31, 1988, now abandoned.

BACKGROUND OF THE INVENTION

This invention relates to the field of superconductor, and more particularly relates to superconducting ceramic pattern and its manufacturing method.

Conventionally, a Nb—Ge metallic material (for example, $Nb_3Ge$) and the like is used as a superconducing material. The application of superconducting materials of this type is limited since a very low temperature is required to make use of superconductivity with such a conventional superconducting material and therefore the driving cost is very high.

In addition, in recent years ceramic materials wich exhibits superconducting properties are known. However, these are also in ingot form and as yet there has been no development of superconducting materials in thin film form.

On the other hand, semiconductor devices provided with a plurality of the elements containing semiconductor integrated circuits within the same substrate are known.

The development of more and more refined semiconductor integrated circuits with high speed action has in recent years become a necessity. Also, along with this refinement a drop in reliability from the heat generated in the semiconductor element and also a reduction in activation speed in the heated parts have become a problem. For this reason, it has been earnestly required to obtain improved structure using superconducting ceramics.

SUMMARY OF THE INVENTION

It is therefore an object of the invention to provide a superconducting pattern which includes low critical temperature regions.

It is another object of the invention to provide a method of selectively lowering the critical temperature of prescribed portions of a superconducting oxide ceramic.

In accordance with the aspect of the invention, the peculiar nature of superconducting oxide ceramics is utilized. The inventor has found by experiment that the Tco (at which resistance disappears) of superconducting ceramics can be controlled by doping of impurity while the Tc onset (at which resistivity drop starts) remains with only little change. The doped portions comes to have relatively broad transition temperature region between Tco and Tc onset. Namely, prescribed portions of a supercoducting ceramic film can be transformed into low Tc regions capable of functioning as resistance or active regions at the Tco of the non-doped portions.

In representative cases, superconducting ceramics for use in accordance with the present invention may be prepared consistent with the stoichiometric formula $(A_{1-x}B_x)_yCu_zO_w$, where A is one or more elements of Groups IIIb and Va of the Periodic Table such as rare earth elements, B is one or more elements of Group IIa of the Periodic Table, e.g., the alkaline earth metals including beryllium and magnesium, and $x=0.1-1$; $y=2.0-4.0$, preferably 2.5–3.5; $z=1.0-4.0$, preferably 1.5–3.5; and $w=4.0-10.0$, preferably 6.0–8.0.

Examples of this general formula are $BiSrCaCu_{2-3}O_{4-10}$, $Y_{0.5}Bi_{0.5}Sr_1Ca_1Cu_{2-3}O_{4-10}$, $YBa_2Cu_3O_{6-8}$, $Bi_1Sr_1Mg_{0.5}Ca_{0.5}Cu_{2-3}O_{4-10}$, $Bi_{0.5}Al_{0.5}SrCaCu_{2-3}O_{4-10}$. These material can be formed on a surface by electron beam evaporation, sputtering, photo-enhanced CVD, photo-enhanced PVD, and so forth.

The superconducting ceramic film is deposited on an insulating surface for example by sputtering with 0.1 to 30 microns in thickness. Prescribed portions of the film are removed by photolithography with a mask to leave the remaining portions which are to be active devices such as Josephson devices and passive devices such as resistance, or wiring. The mask is selectively removed from the prescribed portion of the superconducting ceramic film that are designed to be low Tc regions, ion implantation is effected to the superconducting ceramic film through the remaining mask to produce low Tc regions. After ion implantation, the superconducting film is subjected to thermal treatment to remedy the damage on the crystalline structure due to the bombardment.

BRIEF DESCRIPTION OF THE DRAWINGS

FIGS. 1(A) to 1(C) are cross sectional views showing the manufacturing process of a first embodiment of the present invention.

DETAILED DESCRIPTION OF THE PREFERRED EMBODIMENTS

Referring to FIGS. 1(A) to 1(C), a method of manufacturing superconducting ceramic pattern in accordance with the present invention will be described. In FIG. 1(A), an oxide ceramic thin film 2 is deposited with 0.1 to 1.0 micron in thickness on an insulating single crystalline substrate 1 made of $SrTiO_3$ by low frequency sputtering with a target whose composition is chosen so that the deposited film can be grown into a thin film conforming to the stoichiometric formula $(YBa_2)Cu_3O_{6-8}$. The substrate is heated in an argon-oxygen atmosphere at 700°–1000° C., e.g. 850° C. during sputtering. The deposition condition (including the preparation of the target composition) is controlled to keep not more than 100 ppm, preferably no more than 10 ppm the abundance of the impurity (Si) contained in the deposited ceramic film 2 that is to be added intentionally to the ceramic film in the following process.

Figure 3:
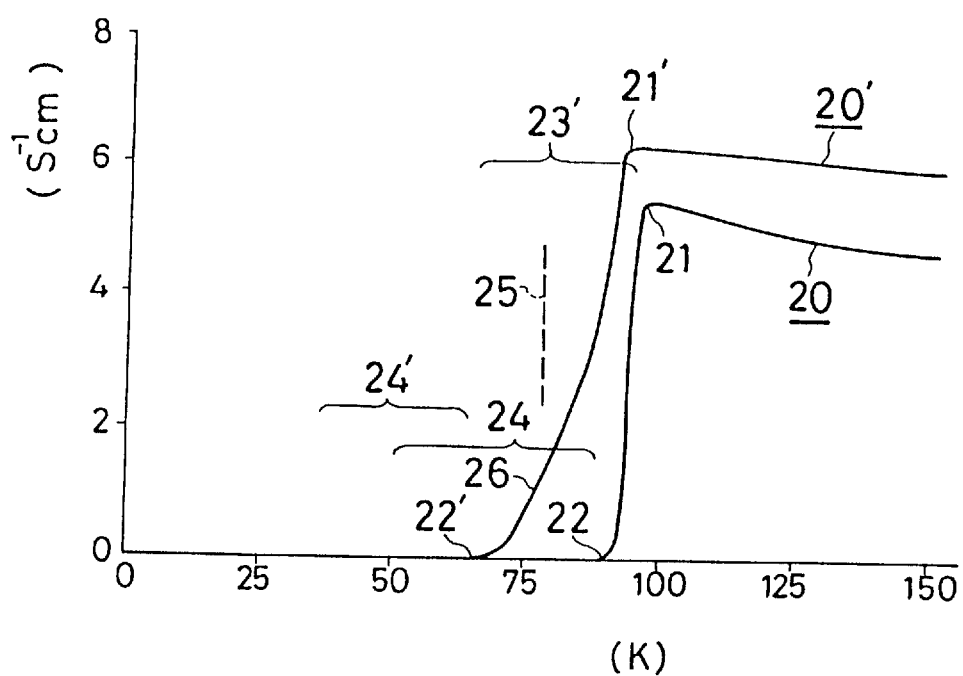
FIG. 3 is graphical diagram showing the relationship between the resistivity and the temperature of superconducting ceramics in accordance with the present invention.

After the completion of sputtering, the ceramic thin film 2 is fired at 800°–1000° C. for 5–50 hours in an oxidizing atmosphere in order to transform the ceramic film into a superconducting single crystalline ceramic film. A curve 20 plotted in FIG. 3 shows the temperature-resistivity relation of the fired ceramic film 1 in accordance with experimental. As shown in the curve, there appears a transition region 23 between Tco 22 at which the resistivity vanishes and Tc onset 21 at which the resistivity starts sharp drop.

Then, a portion 5 of the superconducting ceramic film 2 is doped with silicon by ion implantation through a photoresist mask 3 covering the film 2 (FIG. 1(B)). The impurity density is $5\times10^{15}$ to $2\times10^{22}$ atom/cm$^3$, e.g. $5\times10^{19}$ atom/cm$^3$. Thereafter, the ceramic film 2 is fired again at 700°–1000° C. in an oxidizing atmosphere. This thermal treatment causes the oxidization of the impurity, and therefore lowers the Tc. The resist 3 comes off at the same time in the form of carbon dioxide and water while a portion of the silicon in the ceramic film is oxidized so that the superconducting ceramic contains silicon oxide at 0.1%. The doped portion 11 of the superconducting ceramic film contains the main composition (equal to that of the undoped portion) at about 99%. The resistivity-temperature relation of the superconducting ceramic film was changed according to experimental from the curve 20 to a curve 20' by the doping process. As seen from the curve 20', the Tco was shifted to a lower temperature 22' while the Tc onset was not changed so much. Eventually, the transition region 23' became broad in the doped portion. In this case, the superconducting ceramic film was in a transition condition with a definite resistivity 26 at the temperature 25 of liquid nitrogen. The shift of the critical temperature can be controlled by adjusting the amount of the doping. The doped portion 11 held the relatively low Tco' even after being subjected to a high temperature of 700°–1000° C. during the subsequent process.

Examples of other impurities to be added to superconducting ceramics are Al, Mg, Ga, Ge, Ti, Zr, Fe, Ni, Co, B and P. A plurality of impurities may be used in combination. The doping level should be chosen higher than the level already occuring in the ceramic film, or such an impurity that does not occur in the film may be added to the film.

Figure 2:
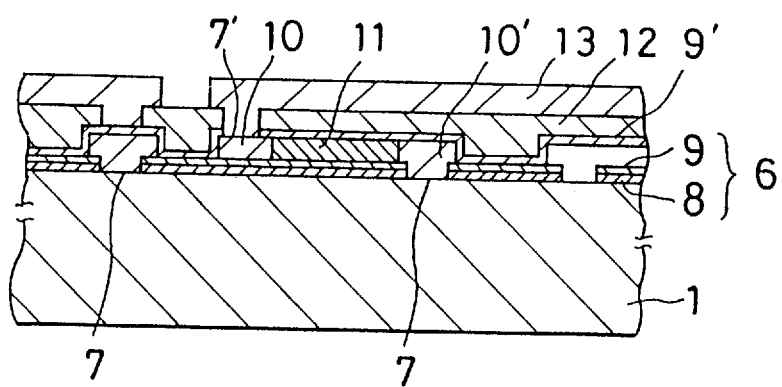
FIG. 2 is a cross sectional view showing a second embodiment of the present invention.

Referring now to FIG. 2, another pattern manufactured in accordance with the present invention will be explained. Within a semiconductor substrate 1 is formed transistors or other devices in advance. A first insulating film 6 is formed and patterned on the upper surface of the substrate 1. The insulating film 6 consists of an underlying film 8 made of silicon oxide and an overlying film 9 made of silicon nitride.

To provide a superconducting circuit on the substrate 1, a superconducting oxide ceramic film is deposited on the substrate 1 over the insulating film 6 by sputtering as in the foregoing embodiment and patterned by photolithography. Then, prescribed portions of the ceramic film are doped with ion impurity in the same way as explained above to produce superconducting wiring 10 and 10' and low Tc regions 11 which can be selectively used as resistances or active regions at the liquid nitrogen temperature. In this second embodiment, the ceramic film is subjected to high temperatures at a lower degree than in the preceding embodiment so that the superconducting ceramic pattern has finally a polycrystalline structure. The devices within the semiconductor substrate are interconnected by the superconducting pattern. The manufacture condition is designed so that the doped regions have a definite resistivity while non-doped regions are superconducting at the liquid nitrogen temperature.

A second insulating film 9' is formed on the substrate 1 over the deposited films thereon together with another insulating film 12 which fills the depressions formed by preceding deposition and provides an even upper surface. Openings 7' are formed on the insulating films 9' and 12 by photolithography. Over the insulating films 9' and 12 is deposited a second superconducting ceramic film 13' by the same process as used in the first embodiment. The second superconducting ceramic film is patterned by photolithography. The first and the second superconducting ceramic films interconnect through the openings 7'.

When the ceramic film is deposited and then transformed into the desired superconducting film by firing, the ion implantation may be effected the ceramic film prior to the transformation. In this case, the formation of the low Tc region and the high Tc region is completed after the firing.

The above devices including superconducting patterns in accordance with the present invention is designed to operate at the liquid nitrogen temperature. However, depending on the possible future development, it may be possible to construct a superconducting ceramic film having a more higher critical temperature such as the dry ice temperature. The present invention can be easily applied to that case by simply replacing the superconducting formation process by the maybe developed process. Also, although in the above description the doped region of the superconducting ceramic film remains yet as a superconducting material, it is not necessarily superconducting but may be normal conducting. Namely, the doping in accordance with the present invention can be effected to destroy the superconducting structure.

Although, in the above description, a semiconductor substrate provided with active devices therein, a ceramic substrate coated with a non-oxide film such as a 50 to 5000 Å thick silicon nitride on its upper surface may be used. For example a YSZ (yttrium stabilized zirconium) substrate is used instead which has a coefficient of thermal expansion substantially same as the ceramic.

Superconducting ceramics for use in accordance with the present invention also may be prepared in consistence with the stoichiometric formula $(A_{1-x}B_x)_yCu_zO_w$, where A is one or more elements of Group IIIb of the Periodic Table, e.g., the rare earth elements, B is one or more elements of Group IIa of the Periodic Table, e.g., the alkaline earth metals including beryllium and magnesium, and x=0–1; y=2.0–4.0, preferably 2.5–3.5; z=1.0–4.0, preferably 1.5–3.5; and w=4.0–10.0, preferably 6.0–8.0. One example is $YBa_2Cu_3O_{6-8}$. Also, superconducting ceramics for use in accordance with the present invention may be prepared consistent with the stoichiometric formula $(A_{1-x}B_x)_yCu_zO_w$, where A is one or more elements of Group Vb of the Periodic Table such as Bi, Sb and As, B is one or more elements of Group IIa of the Periodic Table, e.g., the alkaline earth metals including beryllium and magnesium, and x=0.3–1; y=2.0–4.0, preferably 2.5–3.5; z=1.0–4.0, preferably 1.5–3.5; and w=4.0–10.0, preferably 6.0–8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°–60° K., which is not so high. Relatively high critical temperatures were obtained with samples conforming to the stoichiometric formula $Bi_4Sr_4Ca_2Cu_4O_x$ and $Bi_2Sr_3Ca_2Cu_2O_x$. The number designating the oxygen proportion is 6–10, e.g. around 8.1.

While a description has been made for several embodiments, the present invention should be limited only by the appended claims and should not be limited by the particular examles. For example, superconducting ceramics can be formed by MBE (Electron Beam Epitaxial Growth), vapor phase method, printing and so forth instead of sputtering.

I claim:

1. An electric device utilizing a ceramic oxide superconducting material, said device having a multilayered pattern comprising:

at least two ceramic layered patterns, where said patterns are electrically connected, wherein each said pattern comprises a ceramic superconducting region expressed by a formula $(A_{1-x}B_x)Cu_zO_w$, where A is one or more elements selected from the group IIIb elements of the Periodic Table; B is one or more elements selected from the group IIa elements of the Periodic Table, and where x=0–1, y=2–4, z=1–4, and w=4–10, and a non-superconducting impurity doped region comprising at least the materials in the ceramic superconducting region.

2. An electric device as in claim 1 including means for applying an electrical signal to at least one of said ceramic patterns where said means comprises an electrode or lead.

3. An electric device as in claim 1 where each said pattern comprises a single layer.

4. An electric device comprising:

a substrate; and a film pattern deposited on said substrate, said film pattern comprising a ceramic superconducting region expressed by a formula $(A_{1-x}B_x)_yCu_zO_w$, where A is one or more elements selected from the group IIIb elements of the Periodic Table; B is one or more elements selected from the group IIa elements of the Periodic Table and where x=0–1, y=2–4, z=1–4, and w=4–10, and a non-superconducting impurity doped region comprising at least the materials in the ceramic superconducting region.

5. The device as defined in claim 4, wherein said impurity is at least one material selected from a group consisting of Al, Mg, Si, Ge, Ti, Zr, Fe, Ni, Co, B and P.

6. The device as defined in claim 4, wherein said material of said superconducting region and said material of said non-superconducting region each include a crystalline structure, and the crystalline structure of said superconducting region is substantially the same as the crystalline structure of said non-superconducting region.

7. The device as defined in claim 4, wherein said superconducting region and said non-superconducting region each has a single crystalline structure.

8. The device as defined in claim 4, wherein said superconducting region and said non-superconducting region each has a polycrystalline structure.

9. An electric device as in claim 4 including means for applying an electric signal to said film pattern.

10. The device of claim 9, wherein said electric signal applying means includes at least one of an electrode and a lead.

11. An electric device as in claim 4 where said film pattern comprises a single layer.

12. An electric device comprising, a substrate;

a superconducting film formed on said substrate, said superconducting film comprising a ceramic superconducting material expressed by a formula $(A_{1-x}B_x)_yCu_zO_w$, where A is one or more elements selected from the group IIIb elements of the Periodic Table; B is one or more elements selected from the group IIa elements of the Periodic Table and where x=0–1, y=2–4, z=1–4, and w=4–10; and a nonsuperconducting impurity doped material containing film formed contiguous to said superconducting film on said substrate; said nonsuperconducting material containing film comprising substantially the same ceramic material as that of said superconducting film.

13. The device of claim 12, wherein said nonsuperconducting material containing film has an electrical resistance.

14. The device as defined in claim 12, wherein said impurity is at least one material selected from a group consisting of Al, Mg, Ga, Si, Ge, Ti, Zr, Fe, Ni, Co, B and P.

15. The device in claim 12 wherein said ceramic material includes a crystalline structure and the crystalline structure of said superconducting film is substantially the same as the crystalline structure of said nonsuperconducting material containing film.

16. An electric device as in claim 12 where said nonsuperconducting material containing film and said superconducting film together comprise a single layer.

17. An electric device comprising:

a substrate; and a superconducting film formed on said substrate, said superconducting film including a superconducting ceramic material expressed by a formula $(A_{1-x}B_x)_yCu_zO_w$, where A is one or more elements selected from the group IIIb elements of the Periodic Table; B is one or more elements selected from the group IIa elements of the Periodic Table and where x=0–1, y=2–4, z=1–4, and w=4–10;

wherein the superconductivity of a portion of said superconducting film is reduced as compared to the superconductivity of a remaining portion of said superconducting film by doping said portion with an impurity.

18. The device as defined in claim 17, wherein said impurity is at least one material selected from a group consisting of Al, Mg, Ga, Si, Ge, Ti, Zr, Fe, Ni, Co, B and P.

19. The device as defined in claim 17, wherein said ceramic material includes a crystalline structure and the crystalline structure of said portion of said superconducting film is substantially the same as the crystalline structure of said remaining portion of said superconducting film.

20. An electric device as in claim 17 where said superconducting film comprises a single layer.

21. An electric device utilizing a ceramic oxide superconducting material, said device having a multilayered pattern comprising:

at least two ceramic layered patterns, where said patterns are electrically connected, wherein each said pattern comprises a ceramic oxide superconducting region expressed by a formula $(A_{1-x}B_x)_yCu_zO_w$, where A is one or more elements selected from the group Va elements of the Periodic Table; B is one or more elements selected from the group IIa elements of the Periodic Table and where x=0.3–1, y=2–4, z=1–4, and w=4–10, and a non-superconducting impurity doped region comprising at least the materials in the ceramic oxide superconducting region.

22. An electric device as in claim 21 including means for applying an electrical signal to at least one of said ceramic patterns where said means comprises an electrode or lead.

23. An electric device as in claim 21 where each said pattern comprises a single layer.

24. An electric device comprising a substrate; and a film pattern deposited on said substrate, said film pattern comprising a ceramic oxide superconducting region expressed by a formula $(A_{1-x}B_x)_yCu_zO_w$, where A is one or more elements selected from the group Va elements of the Periodic Table; B is one or more elements selected from the group IIa elements of the Periodic Table and where x=0.3–1, y=2–4, z=1–4, and w=4–10, and a non-superconducting impurity doped region comprising at least the materials in the ceramic oxide superconducting region.

25. The device of claim 24, further including an electric signal applying means for applying electric signal to said film pattern, wherein said electric signal applying means includes at least one of an electrode and a lead.

26. The device as defined in claim 24 wherein said impurity is at least one material selected from a group consisting of Al, Mg, Si, Ge, Ti, Zr, Fe, Ni, Co, B and P.

27. The device as defined in claim 24 wherein said material of said superconducting region and said material of said non-superconducting region each include a crystalline structure, and the crystalline structure of said superconducting region is substantially the same as the crystalline structure of said non-superconducting region.

28. The device as defined in claim 24, wherein said superconducting region and said non-superconducting region each has a single crystalline structure.

29. The device as defined in claim 24, wherein said superconducting region and said non-superconducting region each has a polycrystalline structure.

30. An electric device as in claim 24 including means for applying an electric signal to said film pattern.

31. An electric device as in claim 24 where said film pattern comprises a single layer.

32. An electric device comprising,
    a substrate;
    a superconducting film formed on said substrate, said superconducting film comprising a ceramic oxide superconducting material expressed by a formula $(A_{1-x}B_x)_y Cu_z O_w$, where A is one or more elements selected from the group Va elements of the Periodic Table; B is one or more elements selected from the group IIa elements of the Periodic Table and where $x=0.3-1$, $y=2-4$, $z=1-4$, and $w=4-10$; and
    a nonsuperconducting impurity doped material containing film formed contiguous to said superconducting film on said substrate; said nonsuperconducting material containing film comprising substantially the same ceramic material as that of said superconducting film.

33. The device of claim 32 wherein said nonsuperconducting material containing film has an electrical resistance.

34. The device as defined in claim 32 wherein said impurity is at least one material selected from a group consisting of Al, Mg, Ga, Si, Ge, Ti, Zr, Fe, Ni, Co, B and P.

35. The device in claim 32 wherein said ceramic material includes a crystalline structure and the crystalline structure of said superconducting film is substantially the same as the crystalline structure of said nonsuperconducting material containing film.

36. An electric device as in claim 32 wherein said nonsuperconducting material containing film and said superconducting film together comprises a single layer.

37. An electric device comprising:
    a substrate; and
    a superconducting film formed on said substrate, said superconducting film including a superconducting oxide ceramic material expressed by a formula $(A_{1-x}B_x)_y Cu_z O_w$, where A is one or more elements selected from the group Va elements of the Periodic Table; B is one or more elements selected from the group IIa elements of the Periodic Table and where $x=0.3-1$, $y=2-4$, $z=1-4$, and $w=4-10$;
    wherein the superconductivity of a portion of said superconducting film is reduced as compared to the superconductivity of a remaining portion of said superconducting film by doping said portion with an impurity.

38. An electric device as in claim 37 where said superconducting film comprises a single layer.

39. An electric device utilizing a ceramic oxide superconducting material, said device having a multilayered pattern comprising;
    at least two ceramic layered patterns, where said patterns are electrically connected,
    wherein at least one of said patterns comprises a ceramic copper oxide superconducting region expressed by a formula $(A_{1-x}B_x)_y Cu_z O_w$, where A is one or more elements selected from the group Va elements of the Periodic Table; B is one or more elements selected from the group IIa elements of the Periodic Table, $x=0.3-1$, $y=2-4$, $z=1-4$, and $w=4-10$, and a non-superconducting impurity doped region comprising at least the materials in the ceramic copper oxide superconducting region.

40. An electric device utilizing a ceramic oxide superconducting material, said device having a multilayered pattern comprising;
    at least two ceramic layered patterns, where said patterns are electrically connected,
    wherein at least one of said patterns comprises a ceramic oxide superconducting region expressed by a formula $(A_{1-x}B_x)_y Cu_z O_w$, where A is one or more elements selected from the group IIIb elements of the Periodic Table; B is one or more elements selected from the group IIa elements of the Periodic Table, $x=0-1$, $y=2-4$, $z=1-4$, and $w=4-10$, and a nonsuperconducting impurity doped region comprising at least the materials in the ceramic oxide superconducting region.

41. A device comprising a superconductive copper oxide ceramic film formed on a substrate and in which at least one region of the film is doped with an impurity which is partially oxidized in the film and provides an impurity doped region with an electrical resistivity and temperature characteristic different from that of a remaining non-doped portion of the film so that the impurity doped region can exhibit a finite resistivity at a temperature at which the remaining non-doped portion of the film has zero resistance,
    wherein said superconductive copper oxide ceramic film comprises a superconducting material expressed by a formula $(A_{1-x}B_x)_y Cu_z O_w$, where A is one or more elements selected from the group Va elements of the Periodic Table; B is one or more elements selected from the group IIa elements of the Periodic Table, $x=0.3-1$, $y=2-4$, $z=1-4$, and $w=4-10$.

42. A device as claimed in claim 41 wherein the doping of said impurity doped region is such that it retains its superconductive nature but with a reduced Tco as compared to the remaining non-doped portion of the film.

43. A device as claimed in claim 42 where Tc onset for said impurity doped region is substantially unchanged as compared to the remaining non-doped portion of the film.

44. A device as claimed in claim 41 wherein said substrate comprises a semiconductor substrate.

45. A device as claimed in claim 44 wherein said semiconductor substrate contains semiconductor devices interconnected by superconductive circuitry defined in said superconductive ceramic film.

46. A device as claimed in claim 45 wherein the circuitry defined in said superconductive ceramic film includes at least one resistance constituted by said impurity doped region of the film.

47. A device as claimed in claim 41 wherein said impurity comprises one or more of Si, Al, Mg, Ga, Ge, Ti, Zr, Fe, Ni, Co, B and P.

48. A device as claimed in claim 41 wherein impurity density of the dopant is from $5 \times 10^{15}$ to $2 \times 10^{22}$ atom/cm$^3$.

49. A device comprising a superconductive copper oxide ceramic film formed on a substrate and in which at least one region of the film is doped with an impurity which is partially oxidized in the film and provides an impurity doped region with an electrical resistivity and temperature characteristic different from that of a remaining non-doped portion of the film so that the impurity doped region can exhibit a finite resistivity at a temperature at which the remaining non-doped portion of the film has zero resistance, wherein said superconductive copper oxide ceramic film comprises a superconducting material expressed by a formula $(A_{1-x}B_x)_y Cu_z O_w$, where A is one or more elements selected from the group IIIb elements of the Periodic Table; B is one or more elements selected from the group IIa elements of the Periodic Table, x=0–1, y=2–4, z=1–4, and w=4–10.

* * * * *